US010439092B2

United States Patent
Yutani

(10) Patent No.: US 10,439,092 B2
(45) Date of Patent: Oct. 8, 2019

(54) INFRARED RAY DETECTION ELEMENT AND METHOD FOR MANUFACTURING INFRARED RAY DETECTION ELEMENT

(71) Applicant: Mitsubishi Electric Corporation, Chiyoda-ku (JP)

(72) Inventor: Akie Yutani, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/307,559

(22) PCT Filed: May 23, 2017

(86) PCT No.: PCT/JP2017/019131
§ 371 (c)(1),
(2) Date: Dec. 6, 2018

(87) PCT Pub. No.: WO2018/012115
PCT Pub. Date: Jan. 18, 2018

(65) Prior Publication Data
US 2019/0267508 A1 Aug. 29, 2019

(30) Foreign Application Priority Data
Jul. 12, 2016 (JP) .................. 2016-137531

(51) Int. Cl.
*H01L 27/146* (2006.01)
*H01L 31/11* (2006.01)
*H01L 31/18* (2006.01)

(52) U.S. Cl.
CPC ........ *H01L 31/11* (2013.01); *H01L 27/14649* (2013.01); *H01L 31/18* (2013.01)

(58) Field of Classification Search
None
See application file for complete search history.

(56) References Cited

U.S. PATENT DOCUMENTS 7,911,015 B2 * 3/2011 Sugino ................ G01J 5/02
250/332
2009/0261445 A1 10/2009 Sugino
(Continued)

FOREIGN PATENT DOCUMENTS

| JP | 11-121782 A | 4/1999 |
| JP | 2009-265094 A | 11/2009 |
| JP | 2012-124481 A | 6/2012 |

OTHER PUBLICATIONS

International Search Report dated Aug. 22, 2017 in PCT/JP2017/019131 filed May 23, 2017.

*Primary Examiner* — Jack S Chen
(74) *Attorney, Agent, or Firm* — Oblon, McClelland, Maier & Neustadt, L.L.P.

(57) ABSTRACT

This infrared ray detection element has a diode part that includes serially connected first and second p-n junction diodes. The diode part has: n-type and p-type first regions in a well shape that are adjacent to each other; a p-type second region that constitutes a first p-n junction diode with the n-type first region; and an n-type second region that constitutes a second p-n junction diode with the p-type first region. The n-type and p-type first regions are respectively provided with n-type and p-type third regions that electrically connect the first p-n junction diode and the second p-n junction diode via a conductive material. The n-type first region has a p-type fourth region provided between the p-type first region and the p-type second region. The p-type first region has an n-type fourth region provided between the n-type first region and the n-type second region.

10 Claims, 14 Drawing Sheets

(56) References Cited

U.S. PATENT DOCUMENTS

2012/0146174 A1   6/2012  Zeman et al.
2016/0276335 A1*  9/2016  Laine ................. H01L 29/0626

* cited by examiner

INFRARED RAY DETECTION ELEMENT AND METHOD FOR MANUFACTURING INFRARED RAY DETECTION ELEMENT

TECHNICAL FIELD

The present invention relates to a thermal type infrared ray detection element including a PN junction diode as a temperature sensing element and a method for manufacturing an infrared ray detection element.

BACKGROUND ART

A thermal type (or uncooled type) infrared ray detection element absorbs and converts infrared rays into heat and outputs a temperature change caused by this heat as an electric signal. Thermal type infrared ray detection elements can reduce the total volume of the imaging system since a refrigerator is unnecessary. And recently the price of an infrared ray imaging device is decreasing with the aim of applying to consumer products through mounting the elements on it.

Such a background is encouraging active research and development of an infrared ray detection element that includes a silicon PN junction diode as a temperature sensing element, which can be formed within a general-purpose LSI (large scale integrated circuit) process, and that detects a temperature change of a junction current thereof.

The temperature change rate of the junction current of the silicon PN junction diode is very small as compared to, for example, that of resistance of vanadium oxide, which is also used as a temperature sensing element. Therefore, the infrared ray detection element, having a silicon PN junction diode as a temperature sensing element, has a problem of low sensitivity. Patent Document 1 describes that a sensitivity of an infrared ray detection element is improved by connecting multiple silicon PN junction diodes in series.

PRIOR ART DOCUMENT

Patent Document

Patent Document 1: Japanese Laid-Open Patent Publication No. 2009-265094

SUMMARY OF THE INVENTION

Problem to be Solved by the Invention

In a thermal type infrared ray detection element including a PN junction diode, it is required to reduce the noise of the PN junction diode and thereby improve an S/N ratio (signal/noise ratio). It is also generally required to shrink an infrared ray detection element. The structure of the infrared ray detection element of Patent Document 1 has room for further improvement to suppress an increase in noise due to shrinking.

The object of the present invention is to reduce noise in an infrared ray detection element having a PN junction diode as compared to a conventional technique.

Means for Solving Problem

To solve the problem, the present invention provides an infrared ray detection element comprising: a substrate; and a semiconductor layer disposed separately from the substrate, wherein the semiconductor layer is provided with a diode part including first and second PN junction diodes connected in series, wherein the diode part comprises:
an N-type first region in a well shape and a P-type first region in a well shape facing each other in the semiconductor layer,
a P-type second region disposed in the N-type first region and constituting the first PN junction diode together with the N-type first region, and
an N-type second region disposed in the P-type first region and constituting the second PN junction diode together with the P-type first region, wherein
the N-type first region and the P-type first region are provided with an N-type third region and a P-type third region, respectively, electrically connecting the first PN junction diode and the second PN junction diode via a conductive material, wherein
the N-type first region has a P-type fourth region disposed between the P-type first region and the P-type second region and electrically connected to the conductive material, and wherein
the P-type first region has an N-type fourth region disposed between the N-type first region and the N-type second region and electrically connected to the conductive material.

Effect of the Invention

According to the present invention, an infrared detection element have first PN junction diode made up of the first N-type region and the second P-type region, connected in series to the second PN junction diode made up of the first P-type region and the second N-type region. It also has the fourth P-type region between the first P-type region and the second P-type region, and the fourth N-type region between the first N-type region and the second N-type region. With this structure, holes can be restrained from flowing from the P-type second region via the N-type first region into the P-type first region while electrons can be restrained from flowing from the N-type second region via the P-type first region into the P-type first region, and therefore, noise can be reduced.

MODES FOR CARRYING OUT THE INVENTION (Infrared Ray Imaging Device 1000)

Figure 1:
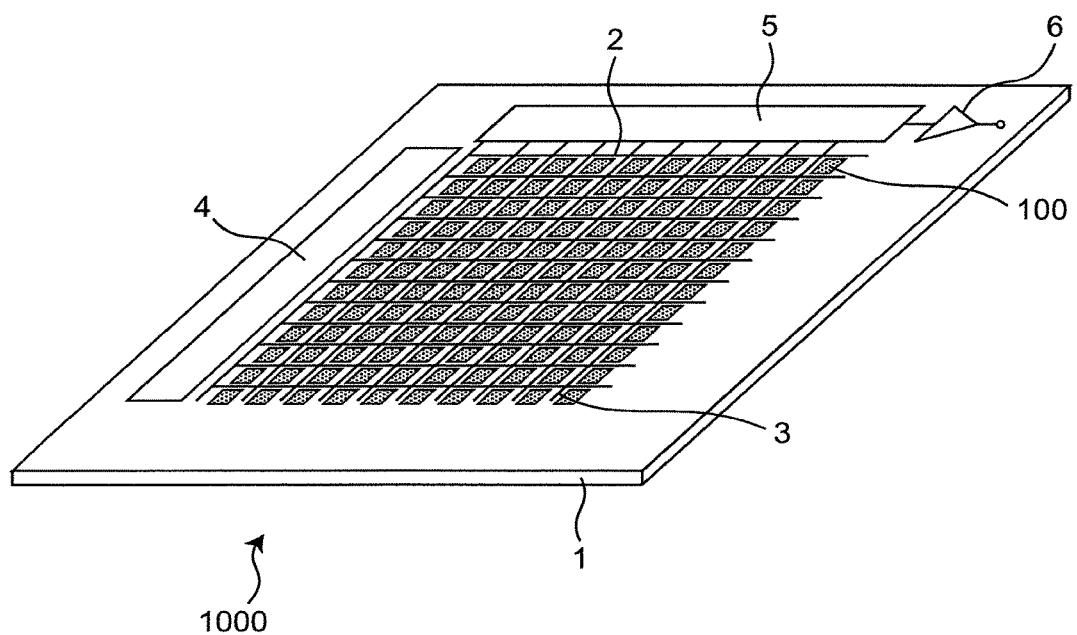
FIG. 1 is a perspective view of an infrared ray imaging device including an infrared ray detection element according to an embodiment of the present invention.

FIG. 1 is a perspective view of an infrared ray imaging device 1000 including an infrared ray detection element according to an embodiment of the present invention.

Figure 2:
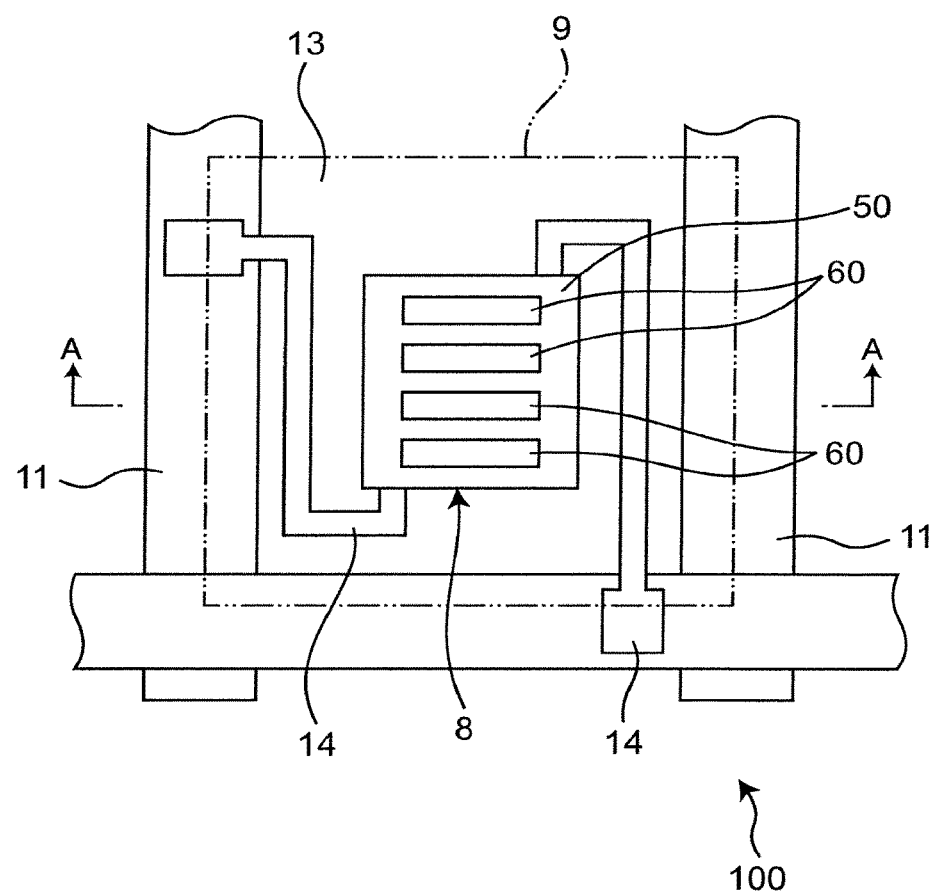
FIG. 2 is a plan view of the infrared ray detection element according to the embodiment of the present invention.
Figure 3:
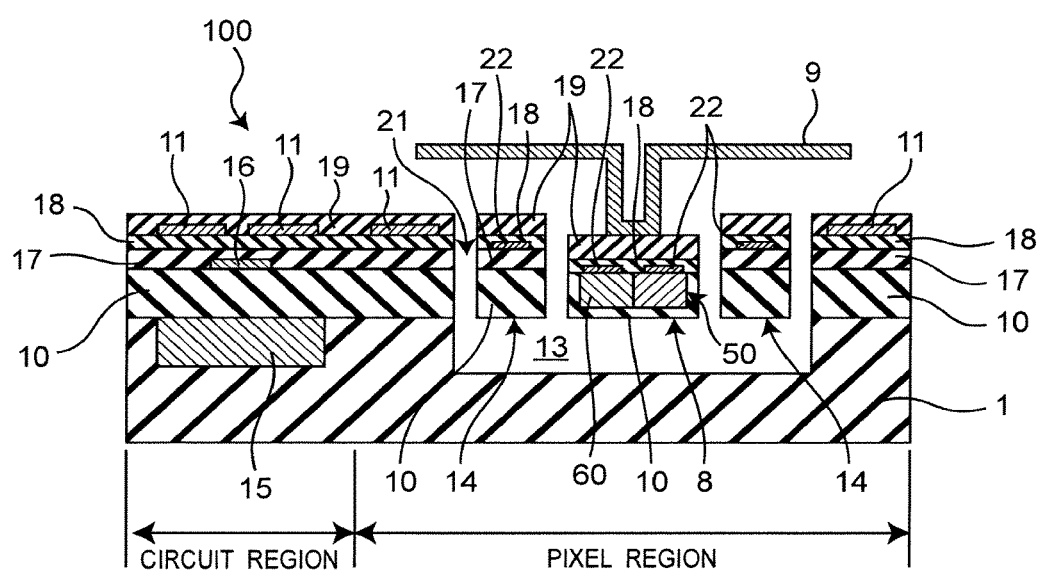
FIG. 3 is a cross-sectional view taken along a line A-A of FIG. 2 as viewed in a direction of arrows.

The infrared ray imaging device 1000 includes a plurality of infrared ray detection elements 100 arranged in a two-dimensional array (or matrix) on a substrate 1. In FIGS. 1 to 3, the infrared ray detection element is denoted by reference numeral 100; however, it should not be understood that an infrared ray detection element 500 described later cannot be mounted on the infrared ray imaging device 1000. The substrate 1 may be an SOI substrate having a buried silicon oxide film layer (hereinafter referred to as a BOX (buried oxide) layer) and a single-crystal silicon layer (silicon-on-insulator layer, hereinafter referred to as an SOI (silicon-on-insulator) layer) sequentially laminated on a single-crystal silicon substrate.

The infrared ray imaging device 1000 is provided with pluralities of selection lines 2 and signal lines 3 along the infrared ray detection elements 100. The selection lines 2 are connected to a drive scanning circuit 4, and the signal lines 3 are connected to a signal scanning circuit 5. The driving scanning circuit 4 and the signal scanning circuit 5 are disposed around the plurality of the infrared ray detection elements 100. The signal scanning circuit 5 is connected to an output amplifier 6.

FIG. 2 is a plan view of the infrared ray detection element 100 according to an embodiment of the present invention, and FIG. 3 is a cross-sectional view taken along a line A-A of FIG. 2 as viewed in a direction of arrows. FIG. 2 shows a plan view when an interlayer insulating film 17, an interlayer insulating film 18, and thin-film wirings 22 shown in FIG. 3 are removed.

The infrared ray detection element 100 has a heat insulating structure formed by a micromachining technique, for example. As shown in FIG. 3, the infrared ray detection element 100 has a pixel region and a circuit region defined therein.

In the pixel region, a temperature detection part 8 is supported by support legs 14 above a cavity part 13 formed in the substrate 1. In this way, the temperature detection part 8 is separated from the substrate having a large heat capacity and is thereby improved in sensitivity to heat.

The temperature detection section 8 is provided with a semiconductor layer 50 covered with an insulating film 10. The semiconductor layer 50 is provided with a diode part 60 described later. The semiconductor layer 50 is, for example, a silicon layer. If the substrate 1 is an SOI substrate, the semiconductor layer 50 is an SOI layer. On the semiconductor layer 50, the thin-film wirings 22 and a protective film 19 are disposed. The thin-film wirings 22 each connected to the semiconductor layer 50 are connected through the support legs 14 to a wiring 11. An infrared ray absorption part 9 is disposed on the protective film 19 so as to absorb and convert incident infrared rays into heat. The infrared ray absorption part 9 has an umbrella structure.

The support legs 14 have a laminated structure including the insulating film 10, the interlayer insulating film 17, the interlayer insulating film 18, the protective film 19, and the thin-film wirings 22. The materials of the insulating film 10, the interlayer insulating film 17, the interlayer insulating film 18, and the protective film 19 may be $SiO_2$ (silicon oxide) or SiN (silicon nitride), for example. The material of the thin-film wirings 22 may be Al (aluminum) or polycrystalline silicon, for example.

On the other hand, the circuit region is provided with the wiring 11 and a circuit part 15 connected to the wiring 11. The material of the wiring 11 may be Al, Ti (titanium), TiN (titanium nitride), W (tungsten), or WSi (tungsten silicide). The circuit part 15 includes the drive scanning circuit 4 and the signal scanning circuit 5 described above.

(Infrared Ray Detection Element)

An infrared ray detection element according to embodiments of the present invention will hereinafter specifically be described with reference to the drawings.

First Embodiment

Figure 4:
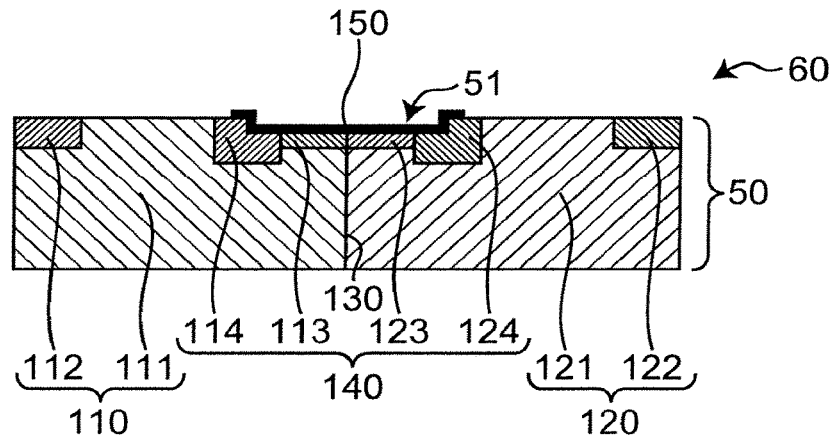
FIG. 4 is a cross-sectional view of a diode part disposed in a temperature detection part of an infrared ray detection element according to a first embodiment of the present invention.

FIG. 4 is a cross-sectional view of the semiconductor layer 50 disposed in the temperature detection part 8 of the infrared ray detection element 100 according to a first embodiment of the present invention. The temperature detection part 8 has the diode part 60 disposed in the semiconductor layer 50. The diode part 60 includes a first PN junction diode 110 and a second PN junction diode 120 connected in series.

The first PN junction diode 110 is made up of an N-type well 111 and a region 112 disposed in the semiconductor layer 50. The region 112 constitutes an anode impurity region of the first and second PN junction diodes 110, 120 connected in series and therefore will hereinafter be referred to as an anode region 112. The second PN junction diode 120 is made up of a P-type well 121 and a region 122 disposed in the semiconductor layer 50. The region 122 constitutes a cathode impurity region of the first and second PN junction diodes 110, 120 connected in series and therefore will hereinafter be referred to as a cathode region 122. The anode region 112 and the cathode region 122 are connected to a constant current source not shown. In the first embodiment, the anode region 112 and the cathode region 122 are disposed on a surface of the semiconductor layer 50.

Hereinafter, for convenience, the principal surface on the side provided with the anode region 112 and the cathode region 122 in the semiconductor layer 50 is referred to as the front surface, and the principal surface on the side opposite to the front surface is referred to as the back surface. If the semiconductor layer 50 is an SOI layer, the back surface of the semiconductor layer 50 is an interface between the SOI layer and a BOX layer.

In the present text, when an impurity region is disposed on the front surface of the semiconductor layer 50, this means that impurities are present in a region within a certain depth from the front surface of the semiconductor layer 50.

The N-type well 111 and the P-type well 121 are partitioned by an interface 130 and disposed adjacently to each other. The anode region 112 is disposed apart from the P-type well 121. Similarly, the cathode region 122 is disposed apart from the N-type well 111.

The N-type well 111 is provided with an N-type contact region 113 and a P-type additional region 114. The P-type well 121 is provided with a P-type contact region 123 and an N-type additional region 124. In the first embodiment, the N-type contact region 113, the P-type additional region 114, the P-type contact region 123, and the N-type additional region 124 are disposed on the front surface of the semiconductor layer 50. In the first embodiment, the P-type additional region 114 is disposed between the anode region 112 and the N-type contact region 113 (e.g., adjacently to the anode region 112 and the N-type contact region 113), and the N-type additional region 124 is disposed between the cathode region 122 and the P-type contact region 123 (e.g., adjacently to the cathode region 122 and the P-type contact region 123).

Figure 20:
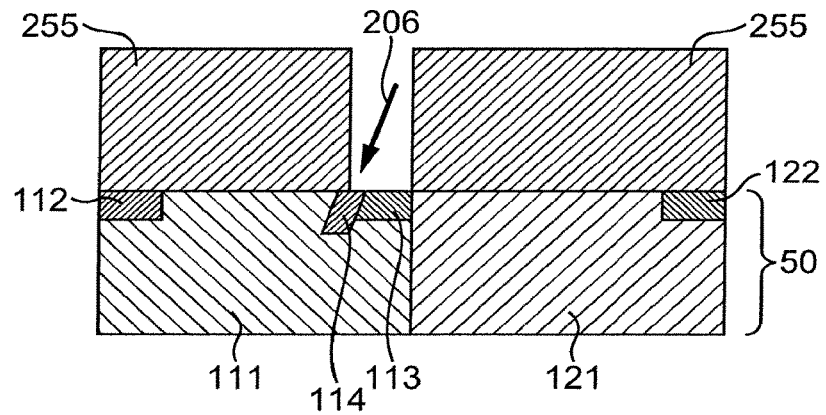
FIG. 20 is a cross-sectional view of the process step for manufacturing the diode part in the semiconductor layer in the infrared ray detection element according to the first embodiment of the present invention.
Figure 23:
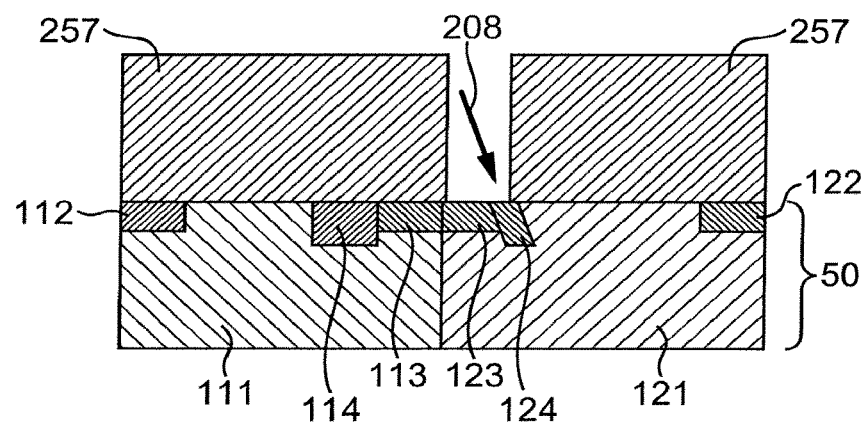
FIG. 23 is a cross-sectional view of the process step for manufacturing the diode part in the semiconductor layer in the infrared ray detection element according to the first embodiment of the present invention.

The P-type additional region 114 is preferably disposed into a range deeper than the N-type contact region 113 in a thickness direction of the semiconductor layer 50. The N-type additional region 124 is preferably disposed into a range deeper than the P-type contact region 123 in the thickness direction of the semiconductor layer 50. As shown in FIGS. 20 and 23, the P-type additional region 114 and the N-type additional region 124 may be obliquely inclined with respect to the thickness direction of the semiconductor layer 50.

The first PN junction diode 110 and the second PN junction diode 120 are electrically connected to each other by a metal film 150 disposed to extend over the N-type well 111 and the P-type well 121. The material of the metal film 150 may be aluminum. The metal film 150 is an example of a conductive material, and, for example, a semiconductor film having a high impurity concentration may be disposed instead of the metal film 150.

As shown in FIG. 4, the metal film 150 is disposed to extend over the N-type contact region 113, the P-type additional region 119, the P-type contact region 123, and the N-type additional region 124, so that these regions constitute a connection region 140 between the first PN junction diode 110 and the second PN junction diode 120.

A concave-shaped contact hole 51 shown in FIG. 4 may be formed in a region provided with the metal film 150 on the front surface of the semiconductor layer 50. By forming the contact hole 51 into a concave shape and disposing the metal film 150 along the shape, a contact area can be increased between the metal film 150 and the first and second PN junction diodes 110, 120 to reduce the contact resistance.

(Operation of Infrared Ray Detection Element 100 According to First Embodiment)

An infrared ray emitted by an object is irradiated on the infrared ray detection element 100 and is absorbed and converted into heat by the infrared ray absorption part 9. This heat is conducted to the temperature detection part 8 coupled to the infrared ray absorption part 9. This increases the temperature of the temperature detection part 8 on the heat insulating structure. In this state, the electrical characteristics of the first and second PN junction diodes 110, 120 change in accordance as the temperature changes. As described above, the anode region 112 and the cathode region 122 of the diode part 60 are connected to the constant current source not shown, and the temperature detection part 8 outputs a voltage of the constant current source.

When a noise generated in the first and second PN junction diodes 110, 120 is smaller, the temperature sensitivity of the infrared ray detection element 100 becomes higher.

The voltage signal of the constant current source output from each of the respective infrared ray detection elements 100 arranged in an array is read through a scanning operation of the driving scanning circuit 4 and the signal scanning circuit 5 and is output from the output amplifier 6. In this way, an infrared image signal is obtained.

The operation of the diode part 60 will be described contrasting with a comparative example. A configuration and an operation of the infrared ray detection element 100 according to the comparative example will be described first.

Comparative Example

Figure 5:
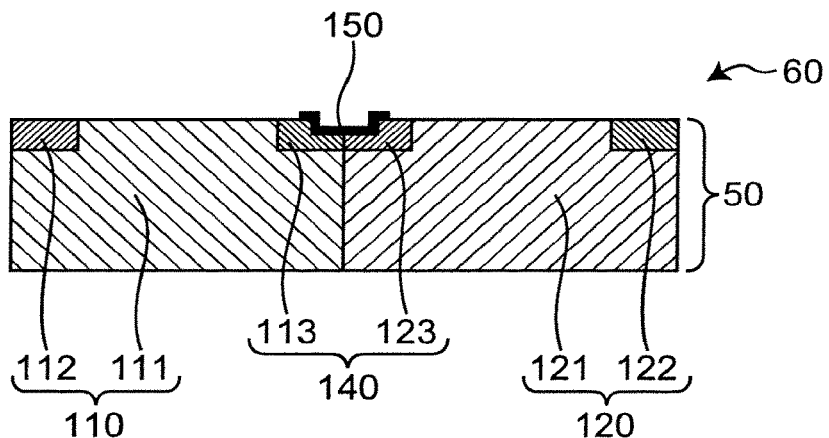
FIG. 5 is a cross-sectional view of a diode part disposed in a temperature detection part of an infrared ray detection element according to a comparative example.

As shown in FIG. 5, the infrared ray detection element according to the comparative example is different from the infrared ray detection element 100 according to the first embodiment in that the P-type additional region 114 and the N-type additional region 124 are not disposed in the diode part 60. In the infrared ray detection element according to the comparative example, the constituent elements common to the infrared ray detection element 100 according to the first embodiment are denoted by the same reference numerals in the description and the drawings.

Holes diffusing from the constant current source through the anode region 112 into the N-type well 111 are responsible for a large portion of the current flowing through the first PN junction diode 110. Most of the holes recombine with electrons in the N-type well 111 when passing through a path 191 shown in FIG. 6. The electrons in the N-type well 111 lost due to the recombination with the holes are supplied from the N-type contact region 113, for example. The current flows through the first EN junction diode 110 mainly through such a process.

However, a current component not following the process described above also flows through the first EN junction diode 110. A problem assumed to be caused by such a current component will be described.

Figure 6:
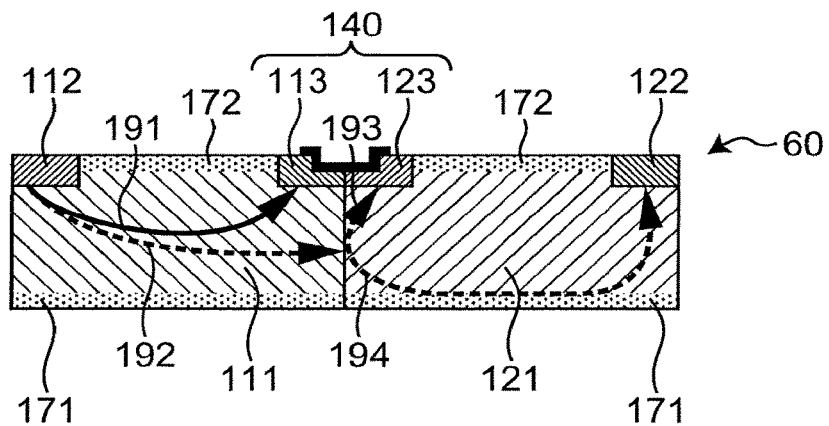
FIG. 6 is a diagram for explaining an operation of the infrared ray detection element according to the comparative example.

First, as shown in FIG. 6, a portion of the holes emitted from the anode region 112 may reach the interface 130 between the N-type well 111 and the P-type well 121 (a path 192) without recombining in the N-type well 111 and may flow into the P-type well 121 beyond the interface 130. This phenomenon prominently occurs in association with miniaturization of the infrared ray detection element. Majority carriers in the P-type well 121 are holes. Therefore, most of the holes passing through the interface 130 move freely inside the P-type well 121 without recombining with electrons.

The holes moving inside the P-type well 121 are finally absorbed by the P-type contact region 123 having a low potential with respect to the holes (a first absorption process) or absorbed by recombination with electrons injected from the cathode region 122 toward the P-type well 121 in a depletion layer formed at the interface (PN junction surface) between the cathode region 122 and the P-type well 121 (a second absorption process). The holes moving inside the P-type well 121 (in particular, holes undergoing the second absorption process) may pass through near the back surface of the semiconductor layer 50 before being absorbed.

In the N-type well 111, an N-type impurity concentration can be made higher in the vicinities of the front surface and the back surface of the semiconductor layer 50 as compared to the vicinity of the center of thickness of the semiconductor layer 50 so that the path 191 shown in FIG. 6 is located in the vicinity of the center of thickness of the semiconductor layer 50 in the depth direction, and similarly, in the P-type well 121, a P-type impurity concentration can be made higher in the vicinities of the front surface and the back surface of the semiconductor layer 50 as compared to the vicinity of the center of thickness of the semiconductor layer 50 (e.g., the technique described in Japanese Laid-Open Patent Publication No. 2006-194784 is usable).

When the P-type well 121 has the P-type impurity concentration made higher in the vicinities of the front surface and the back surface of the semiconductor layer 50 as compared to the vicinity of the center of thickness in this way, most of the holes moving inside the P-type well 121 pass through near the back surface of the semiconductor layer 50.

Figure 7:
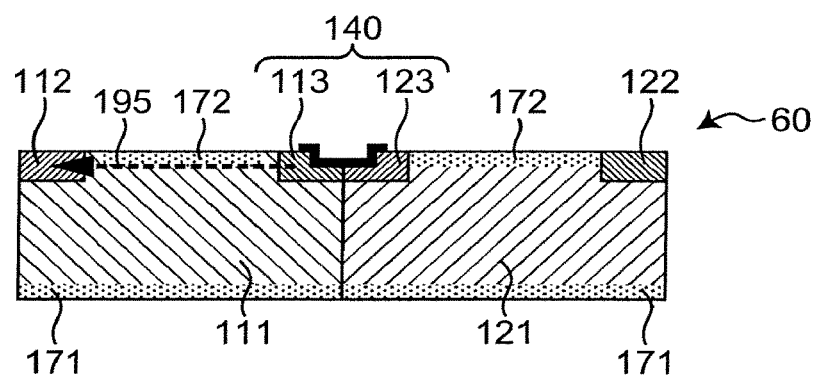
FIG. 7 is a diagram for explaining the operation of the infrared ray detection element according to the comparative example.

As shown in FIG. 7, a portion of the current flowing through the first PN junction diode 110 is generated by electrons emitted from the N-type contact region 113, passing through the N-type well 111 (a path 195) and diffusing into the anode region 112. These electrons tend to pass through a shortest path, i.e., near the front surface of the semiconductor layer 50. Particularly, if the N-type well 111 has the N-type impurity concentration made higher in the vicinities of the front surface and the back surface of the semiconductor layer 50 as compared to the vicinity of the center of thickness as described above, most of the holes moving inside the N-type well 111 pass through near the front surface of the semiconductor layer 50.

The front surface and the back surface of the semiconductor layer 50 have defects caused by physical stress including thermal stress, defects caused by ion implantation, etc. Moreover, if the semiconductor layer 50 is the SOI layer, many defects (lattice distortion, dislocation, etc.) are present on the back surface of the semiconductor layer 50 (i.e., the interface between the SOI layer and the BOX layer). In the drawings, the defects present on the back surface and the front surface of the semiconductor layer 50 are denoted by reference numerals 171 and 172, respectively. When the holes move through regions in which the defects 171, 172 are present, the holes are randomly trapped and remitted due to the defects. In this way, the flowing current randomly varies in the first and second PN junction diodes 110, 120 disposed in the infrared ray detection element according to the comparative example, and it is assumed that this causes a problem of increased noise. This problem becomes prominent as an electric field generated in the anode region 112, the N-type well 111, and the N-type contact region 113 increases in intensity due to the miniaturization of the infrared ray detection element.

As described above, the infrared ray detection element according to the comparative example tends to increase the noise caused by the carriers (holes) emitted from the anode region 112, passing through the interface 130 without recombining in the N-type well 111, and flowing into the P-type well 121, as well as the carriers (electrons) emitted from the N-type contact region 113 in the opposite direction and diffusing into the anode region 112.

Although the first PN junction diode 110 has been described, the noise is caused also in the second PN junction diode 120 through a corresponding process, i.e., by the carriers (electrons) emitted from the cathode region 122, passing through the interface 130 without recombining in the P-type well 121, and flowing into the N-type well 111, as well as the carriers (holes) emitted from the P-type contact region 123 in the opposite direction and diffusing into the cathode region 122.

(Operation of the Diode Part 60 in the First Embodiment)

Figure 8:
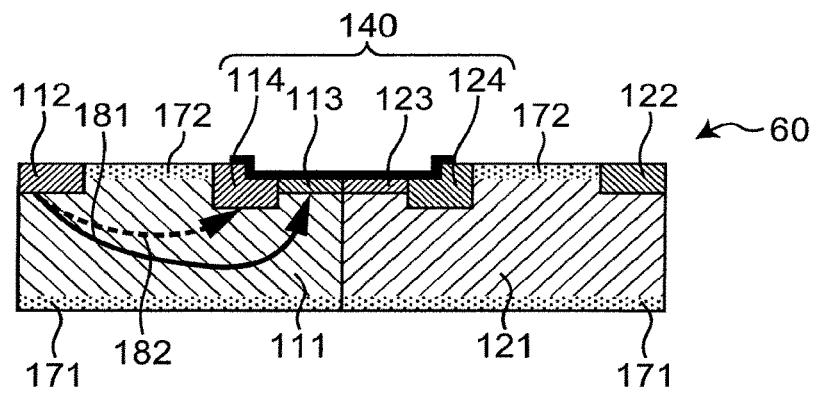
FIG. 8 is a diagram for explaining an operation of the infrared ray detection element according to the first embodiment of the present invention.

The operation of the diode part 60 in the first embodiment will be described with reference to FIG. 8. First, in the first PN junction diode 110, most of the holes diffused from the constant current source via the anode region 112 to the N-type well 111 recombine with electrons in the N-type well 111 when passing through the path 181 shown in FIG. 8 as in the comparative example. In this case, at the interface (PN junction surface) between the P-type additional region 119 and the N-type well 111, an electric field is generated by a potential difference (built-in potential) between both ends of the depletion layer. The holes emitted from the anode region 112 and not recombined in the N-type well 111 are drawn into the P-type additional region 114 by this electric field (a path 182). Therefore, the inflow of the holes from the N-type well 111 to the P-type well 121 is suppressed, and the noise caused by the defect 171 can be reduced.

This effect can be enhanced by disposing the P-type additional region 114 into a range deeper than the N-type contact region 113 in the thickness direction of the semiconductor layer 50.

When viewed from the N-type contact region 113, the P-type additional region 114 having the opposite conduction type exists near the front surface. The P-type additional region 114 serves as a potential barrier against electrons. Therefore, the electrons (the path 195 shown in FIG. 7) emitted from the N-type contact region 113 and diffused through the vicinity of the front surface of the semiconductor layer 50 to the anode region 112 are reduced, so that the occurrence of noise caused by the defect 172 present in the vicinity of the front surface of the semiconductor layer 50 can be suppressed.

In the technique disclosed in Japanese Laid-Open Patent Publication No. 2012-124481, to reduce crosstalk noise caused by carriers diffusing to adjacent photodiode cells in a photodiode, an impurity region having a conduction type opposite to a well is disposed between a region fixing the potential of the well and a photodiode cell, and these are connected to a ground reference potential to discharge carriers to a power source. However, when this technique is employed in the infrared ray detection element 100 of the first embodiment, the potential is fixed in the portion serving as a common contact, so that the sensitivity cannot be improved by connecting the PN junction diodes in series.

Although the first PN junction diode 110 has been described, also in the second PN junction diode 120, the electrons undergoing a corresponding process, i.e., emitted from the cathode region 122 and not recombined in the P-type well 121, are drawn into the N-type additional region 124 by an electric field present between the P-type well 121 and the N-type additional region 124. Therefore, the inflow of the electrons from the P-type well 121 to the N-type well 111 is suppressed, and the noise caused by the defect 171 can be reduced.

This effect can be enhanced by disposing the N-type additional region 124 into a range deeper than the P-type contact region 123 in the thickness direction of the semiconductor layer 50.

When viewed from the P-type contact region 123, the N-type additional region 124 having the opposite conduction type exists near the front surface. The N-type additional region 124 serves as a potential barrier against holes. Therefore, the holes emitted from the P-type contact region 113 and diffused through the vicinity of the front surface of the semiconductor layer 50 to the anode region 112 are reduced, so that the occurrence of noise caused by the defect 172 present in the vicinity of the front surface of the semiconductor layer 50 can be suppressed.

As described above, in the infrared ray detection element 100 according to the first embodiment, the sensitivity is improved by connecting the first and second PN junction diodes 110, 120 in series, and the configuration of the diode part 60 can further reduced the noise increasing due to the miniaturization of the infrared ray detection element 100.

The N-type well 111, the anode region 112, the N-type contact region 113, and the P-type additional region 114 disposed in the semiconductor layer 50 are examples of an N-type first region (in a well shape), a P-type second region, an N-type third region, and a P-type fourth region, respectively. The P-type well 121, the cathode region 122, the P-type contact region 123, and the N-type additional region 124 disposed in the semiconductor layer 50 are examples of a P-type first region (in a well shape), N-type second region, a P-type third region, and an N-type fourth region.

(Manufacturing Method for Infrared Ray Detection Element 100)

An exemplary method for manufacturing the infrared ray detection element 100 according to the first embodiment of the present invention will be described with reference to FIGS. 9 to 29. First, a process step for manufacturing the infrared ray detection element 100 will be described with reference to FIGS. 9 to 13.

Figure 9:
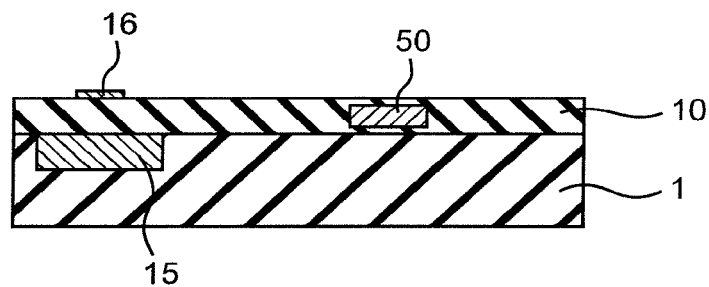
FIG. 9 is a cross-sectional view of the process step for manufacturing the infrared ray detection element.

As shown in FIG. 9, the substrate 1 is prepared, and after the circuit portion 15 is formed in the substrate 1, the insulating film 10 is formed on the substrate 1 by CVD (chemical vapor deposition), for example. At this point, the semiconductor layer 50 is disposed in the insulating film 10 by known photolithography. The diode part 60 is formed in the semiconductor layer 50 by a method described later. Subsequently, a wiring 16 is formed at a position on the insulating film 10 above the circuit portion 15.

Figure 10:
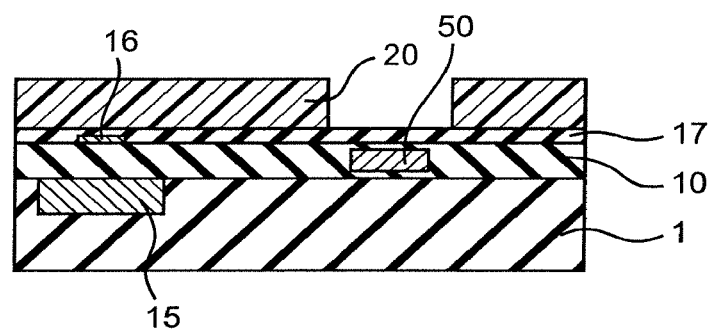
FIG. 10 is a cross-sectional view of the process step for manufacturing the infrared ray detection element.

As shown in FIG. 10, the interlayer insulating film 17 is formed on an entire surface of the insulating film 10 to cover the wiring 16. Subsequently, a photoresist 20 is disposed on the interlayer insulating film 17, and an opening is formed only in an upper portion of a region in which the temperature detection part 8 is formed.

Figure 11:
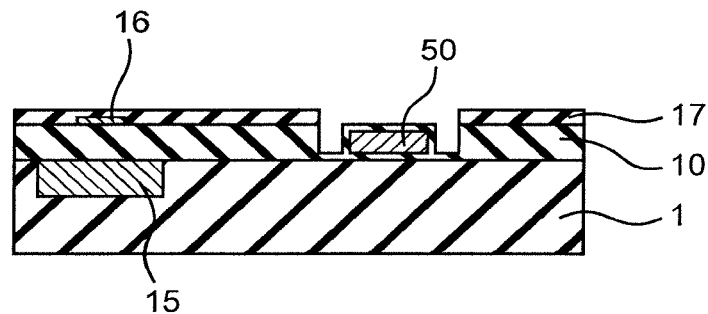
FIG. 11 is a cross-sectional view of the process step for manufacturing the infrared ray detection element.

As shown in FIG. 11, etching is performed by using, for example, a hydrofluoric acid solution, to remove the interlayer insulating film 17 and a portion of the insulating film 10 located above the region in which the temperature detection part 8 is formed. If a hydrofluoric acid solution is used, the insulating film 10 and the interlayer insulating film 17 are selectively etched only in the portion located in the opening region of the photoresist 20, and the insulating film 10 is thinned. The interlayer insulating film 17 and a portion of the insulating film 10 may be removed by dry etching.

Figure 12:
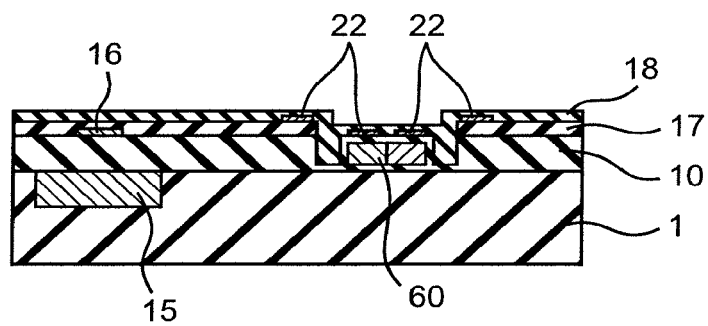
FIG. 12 is a cross-sectional view of the process step for manufacturing the infrared ray detection element.

As shown in FIG. 12, the photoresist 20 is removed. The thin-film wirings 22 are formed on the interlayer insulating film 17. Subsequently, the interlayer insulating film 18 having a desired film thickness is deposited on the interlayer insulating film 17 to cover the thin-film wirings 22.

Figure 13:
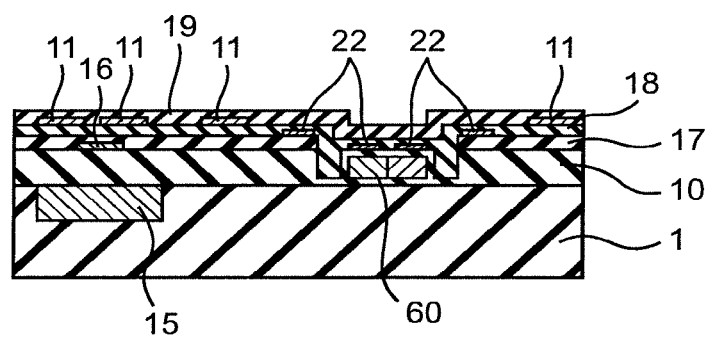
FIG. 13 is a cross-sectional view of the process step for manufacturing the infrared ray detection element.

As shown in FIG. 13, the wiring 11 is formed on the interlayer insulating film 18. Subsequently, the protective film 19 is formed on the interlayer insulating film 18 to cover the wiring 11.

An etching hole 21 and the infrared ray absorption part 9 are formed by dry etching. Subsequently, the cavity part 13 is formed by dry etching using xenon difluoride ($XeF_2$) etc. As a result, the temperature detection part 8 has a hollow structure supported by the support legs 14. Through the steps described above, the infrared ray detection element 100 shown in FIG. 3 is manufactured.

A method for manufacturing the diode part 60 in the semiconductor layer 50 will be described with reference to FIGS. 14 to 29.

Figure 14:
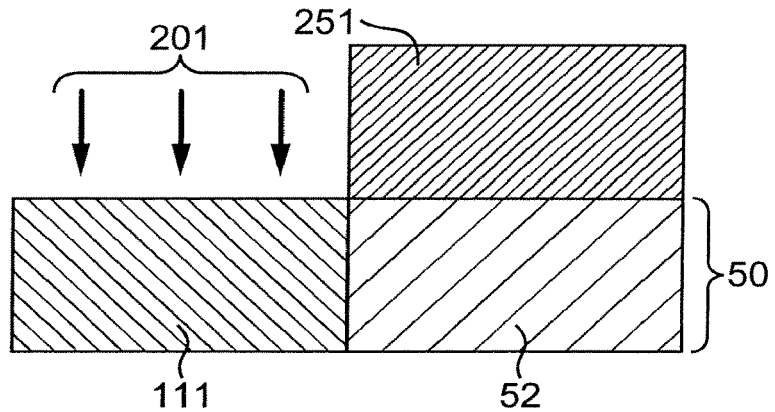
FIG. 14 is a cross-sectional view of the process step for manufacturing the diode part in a semiconductor layer in the infrared ray detection element according to the first embodiment of the present invention.
Figure 15:
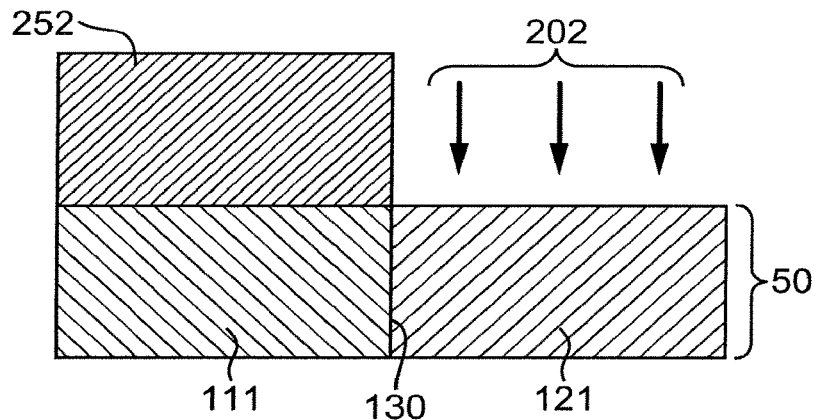
FIG. 15 is a cross-sectional view of the process step for manufacturing the diode part in the semiconductor layer in the infrared ray detection element according to the first embodiment of the present invention.

First, as shown in FIG. 14, a photoresist 251 is patterned on the semiconductor layer 50, and ions 201 are implanted to form the N-type well 111. As shown in FIG. 15, a photoresist 252 is patterned on a portion 52 (see FIG. 14) of the semiconductor layer 50, and ions 202 are implanted to form the P-type well 121 adjacent to the N-type well 111. The interface 130 is formed between the N-type well 111 and the P-type well 121.

Figure 16:
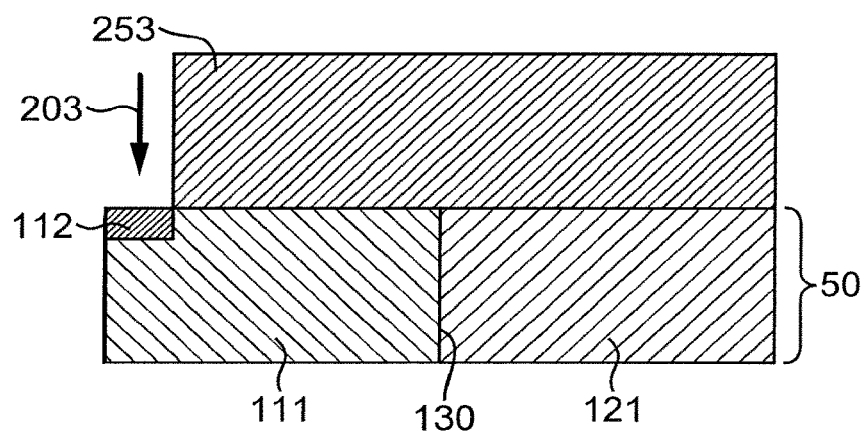
FIG. 16 is a cross-sectional view of the process step for manufacturing the diode part in the semiconductor layer in the infrared ray detection element according to the first embodiment of the present invention.
Figure 17:
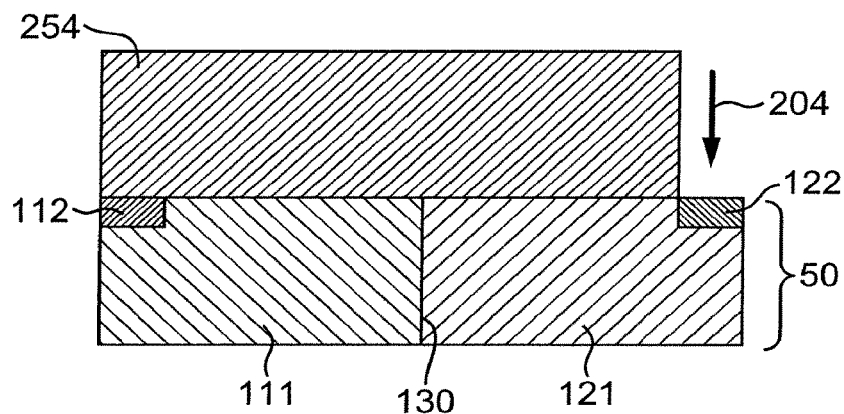
FIG. 17 is a cross-sectional view of the process step for manufacturing the diode part in the semiconductor layer in the infrared ray detection element according to the first embodiment of the present invention.

As shown in FIG. 16, a photoresist 253 is patterned on the semiconductor layer 50, and ions 203 are implanted to form the anode region 112 in the N-type well Ill. As shown in FIG. 17, a photoresist 254 is patterned on the semiconductor layer 50, and ions 204 are implanted to form the cathode region 122 in the P-type well 121.

Figure 18:
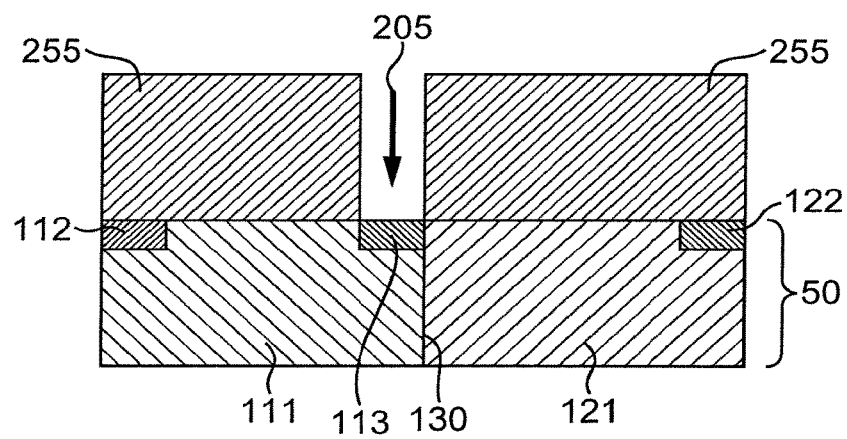
FIG. 18 is a cross-sectional view of the process step for manufacturing the diode part in the semiconductor layer in the infrared ray detection element according to the first embodiment of the present invention.

As shown in FIG. 18, a photoresist 255 is patterned on the semiconductor layer 50, and ions 205 are implanted to form the N-type contact region 113.

Figure 19:
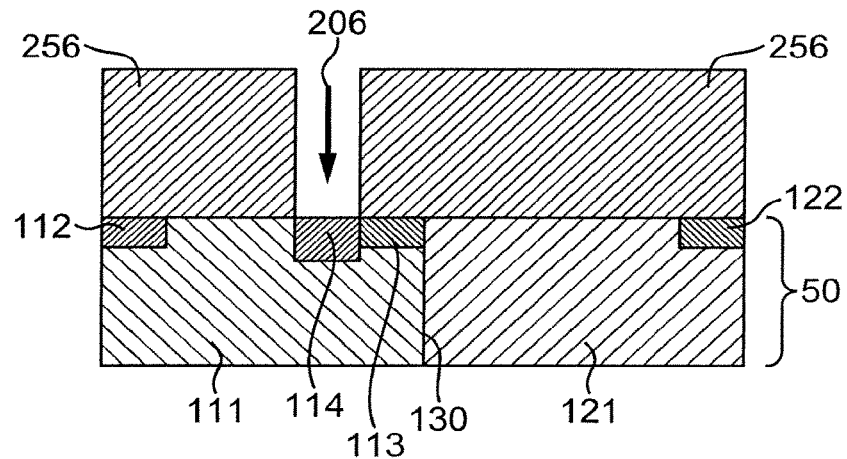
FIG. 19 is a cross-sectional view of the process step for manufacturing the diode part in the semiconductor layer in the infrared ray detection element according to the first embodiment of the present invention.

As shown in FIG. 19, a photoresist 256 is patterned on the semiconductor layer 50, and ions 206 are implanted to form the P-type additional region 114 adjacent to the N-type contact region 113. As shown in FIG. 20, the photoresist 255 patterned at the previous step may be used as it is to form the P-type additional region 114 by implanting the ions 206 obliquely with respect to the opening direction of the photoresist 255.

Figure 21:
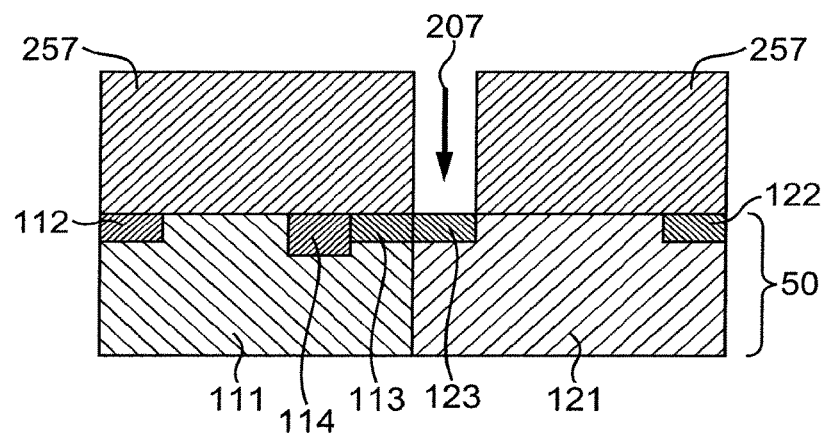
FIG. 21 is a cross-sectional view of the process step for manufacturing the diode part in the semiconductor layer in the infrared ray detection element according to the first embodiment of the present invention.

As shown in FIG. 21, a photoresist 257 is patterned on the semiconductor layer 50, and ions 207 are implanted to form the P-type contact region 123.

Figure 22:
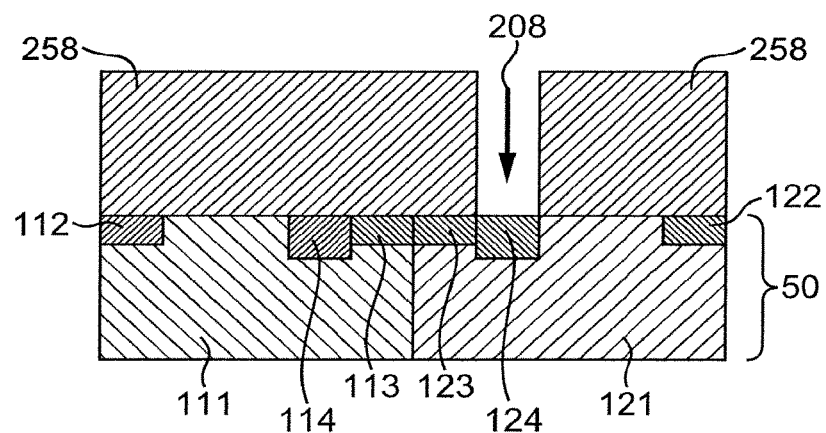
FIG. 22 is a cross-sectional view of the process step for manufacturing the diode part in the semiconductor layer in the infrared ray detection element according to the first embodiment of the present invention.

As shown in FIG. 22, a photoresist 258 is patterned on the semiconductor layer 50, and ions 208 are implanted to form the N-type additional region 124 adjacent to the P-type contact region 123. As shown in FIG. 23, the photoresist 257 patterned at the previous step may be used as it is to form the N-type additional region 124 by implanting the ions 208 obliquely with respect to the opening direction of the photoresist 257.

Figure 24:
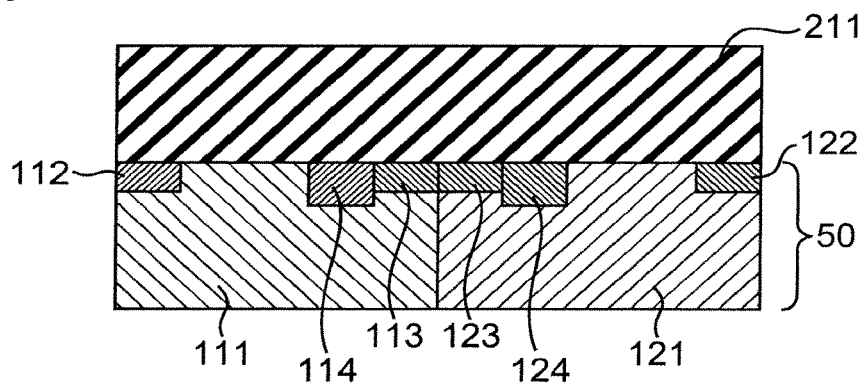
FIG. 24 is a cross-sectional view of the process step for manufacturing the diode part in the semiconductor layer in the infrared ray detection element according to the first embodiment of the present invention.
Figure 25:
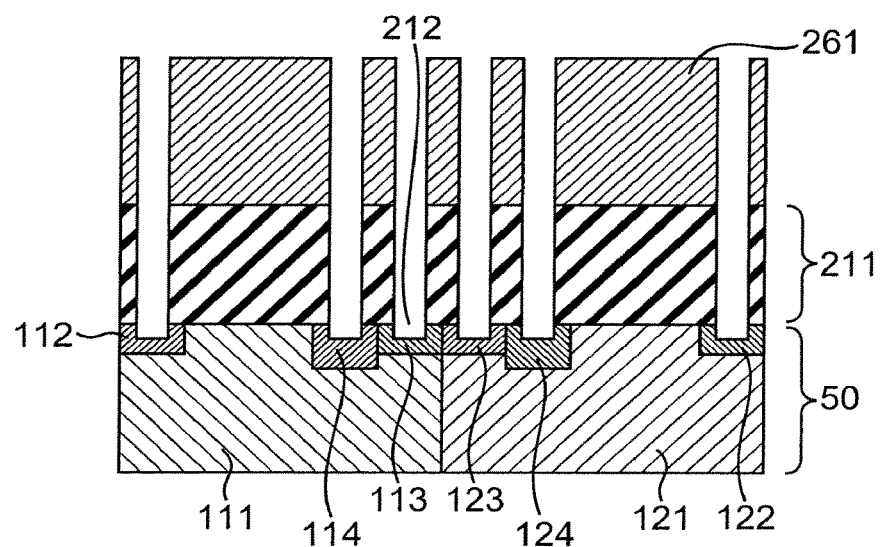
FIG. 25 is a cross-sectional view of the process step for manufacturing the diode part in the semiconductor layer in the infrared ray detection element according to the first embodiment of the present invention.
Figure 26:
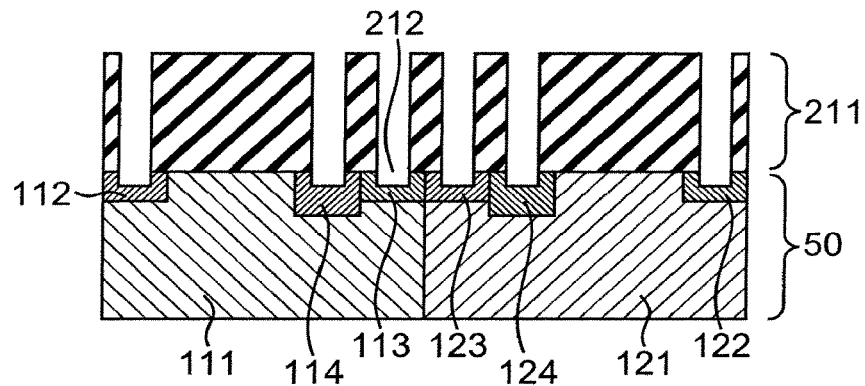
FIG. 26 is a cross-sectional view of the process step for manufacturing the diode part in the semiconductor layer in the infrared ray detection element according to the first embodiment of the present invention.

As shown in FIG. 24, an insulating film 211 is disposed an entire surface of the semiconductor layer 50 by CVD, for example. As shown in FIG. 25, a photoresist 261 is applied, and resist patterning and etching are performed to form an opening portion (contact hole) 212. As shown in FIG. 26, the photoresist 261 is removed.

Figure 27:
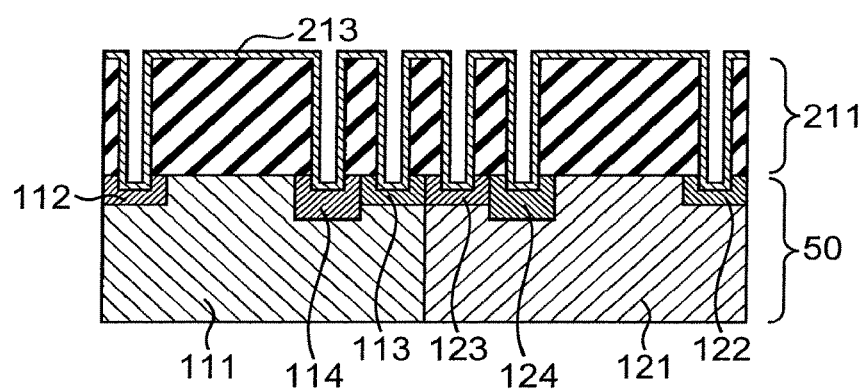
FIG. 27 is a cross-sectional view of the process step for manufacturing the diode part in the semiconductor layer in the infrared ray detection element according to the first embodiment of the present invention.
Figure 28:
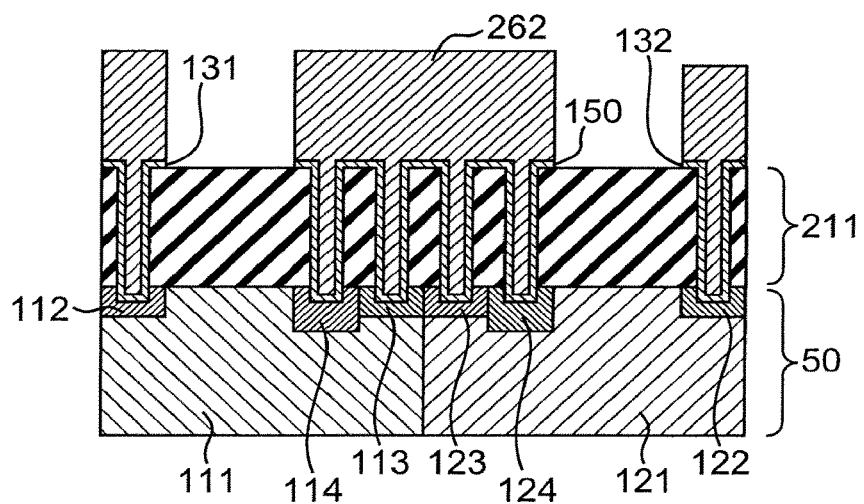
FIG. 28 is a cross-sectional view of the process step for manufacturing the diode part in the semiconductor layer in the infrared ray detection element according to the first embodiment of the present invention.
Figure 29:
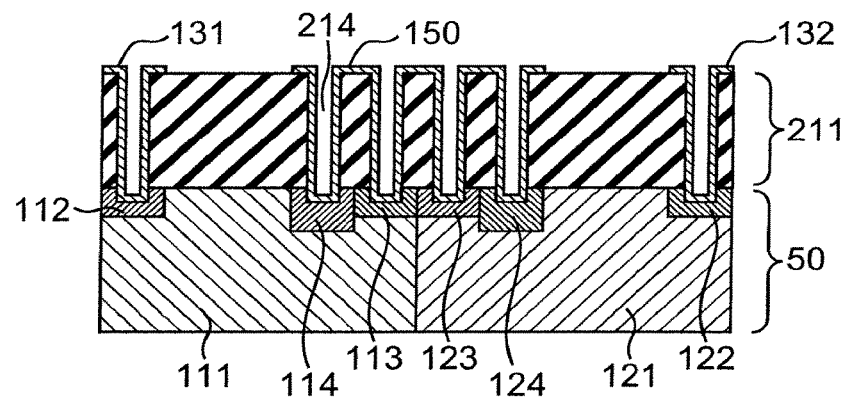
FIG. 29 is a cross-sectional view of the process step for manufacturing the diode part in the semiconductor layer in the infrared ray detection element according to the first embodiment of the present invention.

As shown in FIG. 27, a film of wiring metal 213 is formed. As shown in FIG. 28, a photoresist 262 is applied for patterning to etch the wiring metal 213 to form the metal film 150, other wirings 131, 132, and contacts 214. As shown in FIG. 29, the photoresist 262 is removed. A structure shown in FIG. 29 corresponds to the structure shown in FIG. 4. However, FIG. 29 is different from the structure shown in FIG. 4 in that the contacts 214 are respectively disposed for the N-type contact region 113, the P-type additional region 114, the P-type contact region 123, and the N-type additional region 124.

The method described above is merely an exemplary method for manufacturing the first and second PN junction diodes 110, 120 in the semiconductor layer 50, and another method may be used as long as the same structure can be obtained.

For example, the order of disposition of the N-type well 111, the P-type well 121, the anode region 112, the cathode region 122, the N-type contact region 113, the P-type additional region 114, the P-type contact region 123, and the N-type additional region 124 may not be the described order and may be modified as appropriate. These regions 111 to 114, 121 to 124 may be formed by thermal diffusion etc. of impurities, rather than ion implantation.

Some or all of the regions 111 to 114, 121 to 124 may not be formed before forming the insulating film 211 and may be formed by using a so-called self-aligned contact (SAC) using the insulating film 211 as a mask.

In the above description, the contacts 214 are respectively individually formed for the regions 113, 114, 123, 124 (see FIG. 25); however, in a modification example, a common opening portion may be formed in these regions, and a film of the wiring metal 213 may be formed thereon to form a contact common to these regions (see FIG. 4).

In the above description, a film of the wiring metal 213 is directly formed, and the patterning is subsequently performed with the resist 262 to dispose the contact hole 212; however, in a modification example, a so-called tungsten plug process may be used such that after the contact hole 212 is opened, the inside is filled with a tungsten film, which is followed by planarization with chemical mechanical polishing (CMP) or an etch-back method, before formation of the film of the wiring metal 213.

If the substrate 1 is the SOI substrate, the method for manufacturing the infrared ray detection element 100 includes a step of forming an element isolating region such as a LOCOS (local oxidation of silicon) oxide film and STI (shallow trench isolation), and this is a known technique and will not be.

Second Embodiment

In a second embodiment, the impurity concentration of the P-type contact region 123 and the P-type additional region 114 is made higher than the impurity concentration of the P-type well 121, and the impurity concentration of the N-type contact region 113 and the N-type additional region 124 is made higher than the impurity concentration of the N-type well 111. The other configurations of the second embodiment are the same as the first embodiment and will not be described.

A first effect obtained from the second embodiment will be described. As described above, by disposing the P-type additional region 114 in the N-type well 111, the holes emitted from the anode region 112 and not recombined in the N-type well 111 are drawn into the P-type additional region 114 by the electric field in the depletion layer formed at the interface between the N-type well 111 and the P-type additional region 114. On the other hand, the interface 130 between the N-type well 111 and the P-type well 121 is also a PN junction surface, and a depletion layer is formed at the interface 130, so that an electric field drawing holes is generated in the depletion layer.

A magnitude of the electric field generated in the depletion layer increases along with a built-in potential, and the built-in potential becomes larger when the impurity concentration is larger in at least one of the semiconductors constituting the PN junction. In the second embodiment, since the impurity concentration of the P-type additional region 114 is made higher than the impurity concentration of the P-type well 121, the electric field in the depletion layer formed at the interface between the N-type well 111 and the P-type additional region 114 (accordingly, an electrostatic force drawing holes) becomes larger as compared to the electric field in the depletion layer formed at the interface between the N-type well 111 and the P-type well 121.

Similarly, in the second embodiment, since the impurity concentration of the N-type additional region 124 is made higher than the impurity concentration of the N-type well 111, the electric field in the depletion layer formed at the interface between the P-type well 121 and the N-type additional region 124 (accordingly, an electrostatic force drawing holes) becomes larger as compared to the electric field in the depletion layer formed at the interface between the P-type well 121 and the N-type well 121.

As a result, in the second embodiment, the effect of the first embodiment can be enhanced.

A second effect obtained from the second embodiment will be described. When the first and second diodes 110, 120 are used as two diodes connected in series, it is preferable that the N-type well 111 and the P-type well 121 be close to the same potential. This is realized, for example, by reducing a potential difference between the N-type well 111 and the metal film 150 and a potential difference between the P-type well 121 and the metal film 150.

In the second embodiment, the impurity concentration of the P-type contact region 123 is made higher than at least the impurity concentration of the P-type well 121, and the impurity concentration of the N-type contact region 113 is made higher than at least the impurity concentration of the N-type well 111, and therefore, a contact resistance becomes smaller between the N-type well 111 and the metal film 150 as well as between the P-type well 121 and the metal film 150. This reduces the potential difference between the N-type well 111 and the metal film 150 and the potential difference between the P-type well 121 and the metal film 150.

In a third effect obtained from the second embodiment, by increasing the impurity concentrations of the N-type contact region 113, the P-type additional region 114, the P-type contact region 123, and the N-type additional region 124, the potential felt by the holes and the electrons trapped in these regions can be made sufficiently deep so as to reduce the possibility of emission of the holes and the electrons from these regions. Therefore, even if these regions 113, 114, 123, 124 are not connected by a metal film, the effect described in the first embodiment can sufficiently be maintained. Therefore, it is no longer necessary to fix the potentials of these regions 113, 114, 123, 124, and the infrared ray detection element 100 suitable for series connection of multiple PN junction diodes can be obtained.

Third Embodiment

Figure 30:
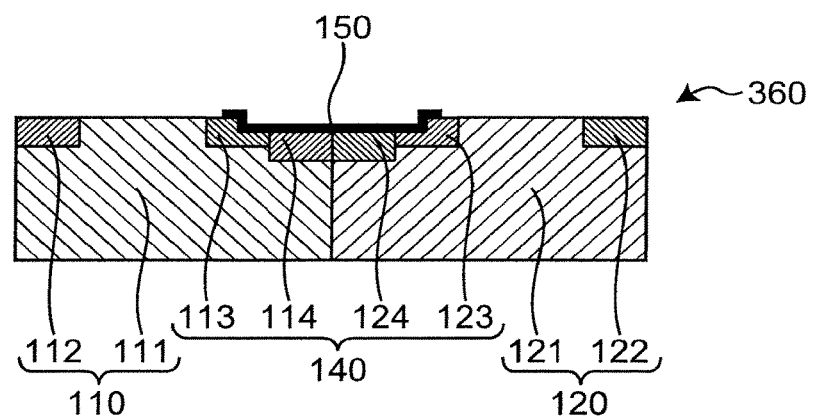
FIG. 30 is a cross-sectional view of a diode part of an infrared ray detection element according to a fourth embodiment of the present invention.

FIG. 30 is a cross-sectional view of a diode part 360 of an infrared ray detection element according to a third embodiment of the present invention. The diode part 360 has the N-type contact region 113 disposed between the anode region 112 and the P-type additional region 114 as well as the P-type contact region 123 disposed between the cathode region 122 and the N-type additional region 124. As described above, the diode part 360 has the P-type additional region 114 and the N-type additional region 124 arranged differently from the diode part 60 of the first embodiment.

The other configurations of the third embodiment are the same as the first and second embodiments and the will not be described.

Figure 31:
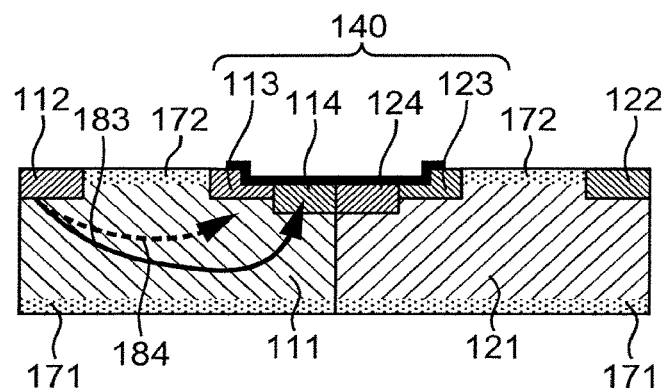
FIG. 31 is a diagram for explaining the effects of the infrared ray detection element according to the fourth embodiment of the present invention.

The effects obtained from the third embodiment will be described. Most of holes diffused from the constant current source via the anode region 112 to the N-type well 111 recombine with electrons in the N-type well 111 when passing through a path 183 shown in FIG. 31. In this case, an electric field is generated by the built-in potential at the interface (PN junction surface) between the P-type additional region 114 and the N-type well 111. The holes emitted from the anode region 112 and not recombined in the N-type well 111 are drawn into the P-type additional region 114 by this electric field (a path 184).

Therefore, the inflow of the holes to the P-type well 121 is suppressed, and the noise caused by the defect 171 present on the back surface of the semiconductor layer 90 can be reduced. Particularly in the third embodiment, since the P-type additional region 119 is disposed in the region closer to the P-type well 121, the effect of suppressing the inflow of the holes to the P-type well 121 can be enhanced. Similarly, in the third embodiment, since the N-type additional region 124 is disposed in the region closer to the N-type well 111, the effect of suppressing the inflow of current to the N-type well 111 can be enhanced.

For example, in the noise generated in the infrared ray detection element 100, a component of noise caused by the defect 171 present on the back surface of the semiconductor layer 40 is greater than a component of noise caused by the defect 172 present on the front surface of the semiconductor layer 40, the third embodiment may be employed for the arrangement of the P-type additional region 114 and the N-type additional region 124.

As described in the second embodiment, the effect of the third embodiment can be enhanced by making the impurity concentration of the P-type contact region 123 and the P-type additional region 114 higher than the impurity concentration of the P-type well 121 and making the impurity concentration of the N-type contact region 113 and the N-type additional region 124 higher than the impurity concentration of the N-type well 111.

Fourth Embodiment

Figure 32:
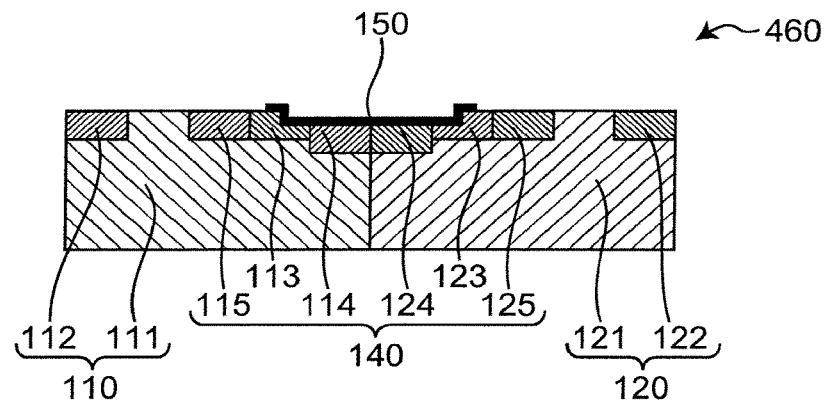
FIG. 32 is a cross-sectional view of the diode part disposed in a temperature detection part of the infrared ray detection element according to a modification example of the fourth embodiment of the present invention.

FIG. 32 is a cross-sectional view of a diode part 460 of an infrared ray detection element according to a fourth embodiment of the present invention. As in the diode part 360 of the third embodiment, the diode part 460 has the N-type contact region 113 disposed between the anode region 112 and the P-type additional region 114 as well as the P-type contact region 123 disposed between the cathode region 122 and the N-type additional region 124.

Additionally, the diode part 460 has a second P-type additional region 115 disposed between the anode region 112 and the N-type contact region 113 (e.g., at a predetermined distance from the anode region 112 and adjacent to the N-type contact region 113) as well as a second N-type additional region 125 disposed between the cathode region 122 and the P-type contact region 123 (e.g., at a predetermined distance from the cathode region 122 and adjacent to the P-type contact region 123). Therefore, the diode part 460 corresponds to a configuration acquired by combining the diode part 60 of the first embodiment and the diode part 360 of the third embodiment.

According to the fourth embodiment, while suppressing the inflow of holes into the P-type well 121 (the inflow of current into the N-type well 111) to significantly reduce the noise caused by the defect 171 present on the back surface of the semiconductor layer 50 as described in the third embodiment, the electrons diffusing from the N-type contact region 113 through the vicinity of the front surface of the semiconductor layer 50 into the anode region 112 are reduced, so that the occurrence of noise caused by the defect 172 present in the vicinity of the front surface of the layer 50 can be suppressed as described in the first embodiment.

Fifth Embodiment

Figure 33:
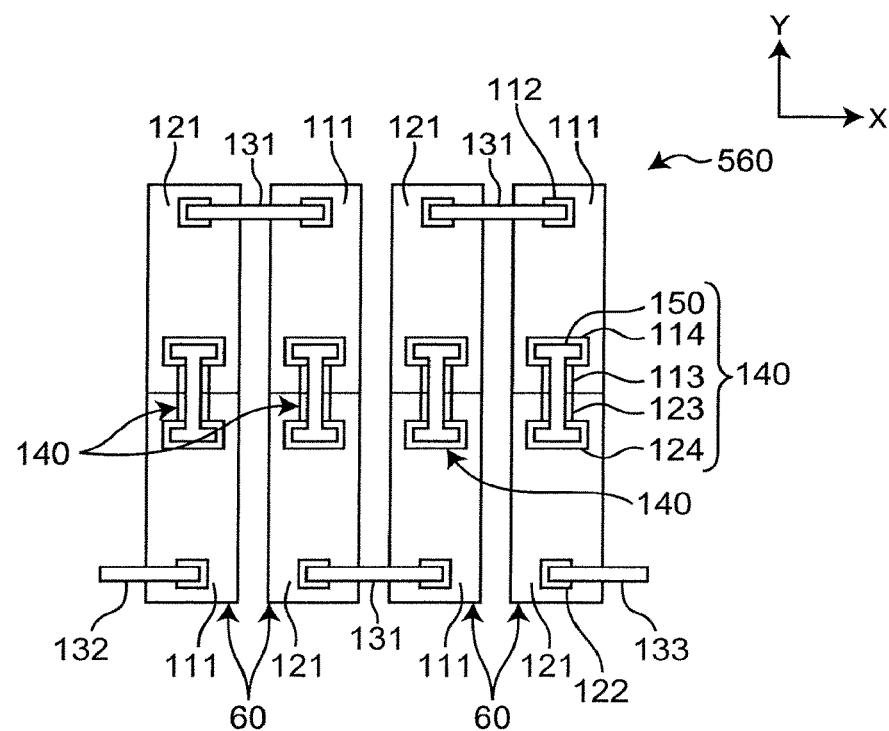
FIG. 33 is a plan view of an infrared ray detection element according to fifth embodiment of the present invention.

FIG. 33 is a plan view of an infrared ray detection element 500 according to a fifth embodiment of the present invention. The infrared ray detection element 500 has the four diode parts 60 of the first or second embodiment arranged side by side in an X direction shown in FIG. 33. A Y direction shown in FIG. 33 is a direction along a current path in the diode parts 60 and is the length direction of the diode parts 60. The X direction is a direction that is an in-plane direction of the semiconductor layer 50 and perpendicular to the Y direction and is the width direction of the diode parts 60. Although the four diode parts 60 are disposed in the fifth embodiment, the present invention is not limited thereto, and the number of the disposed diode parts 60 may be three or less or five or more.

As described above, the first and second PN junction diodes 110, 120 are connected in series by the N-type contact region 113, the P-type additional region 114, the P-type contact region 123, and the N-type additional region 129 constituting the connection region 140.

The diode parts 60 neighboring in X direction have adjacent first PN junction diode 110 and the second PN junction diode 120, and the directions of these diode parts 60 are in reverse. The diode parts 60 adjacent in the X direction are electrically connected by the wiring 131 between the anode region 112 of the first PN junction diode 110 and the cathode region 122 of the second PN junction diode 120 adjacent in the X direction. The wirings 132, 133 are led out from the anode region 112 of the diode part 60 located at one end in the X direction and the cathode region 122 of the diode part 60 located at the other end.

As shown in FIG. 33, the dimension of the P-type additional region 114 in the X direction is larger than the dimension of the N-type contact region 113 in the X direction. The dimension of the N-type additional region 124 in the X direction is larger than the dimension of the P-type contact region 123 in the X direction. This can enhance the effect of reducing the electrons diffusing from the N-type contact region 113 through the vicinity of the front surface of the semiconductor layer 50 into the anode region 112 so that the occurrence of noise caused by the defect 172 present in the vicinity of the front surface of the layer 50 can be suppressed.

Although the present invention has been described with reference to a plurality of embodiments, it should be understood that all the embodiments are illustrative in all respects and that the present invention is not limited to the embodiments described above. The scope of the present invention is defined by claims rather than the above description and is intended to include the meaning equivalent to the claims and all modification examples within the scope. The features described in the embodiments described above may freely be combined.

EXPLANATIONS OF LETTERS OR NUMERALS 1 substrate; 8 temperature detection part; 9 infrared ray absorption part; 50 semiconductor layer; 60, 360, 460 diode part; 100, 500 infrared ray detection element; 110 first PN junction diode; 111 N-type well; 112 anode region; 113 N-type contact region; 114 P-type additional region; 115 second P-type additional region; 120 second PN junction diode; 121 P-type well; 122 cathode region; 123 P-type contact region; 124 N-type additional region; 125 second N-type additional region; 130 interface (between N-type and P-type wells); 140 connection region (between first and second PN junction diodes); 150 metal film; and 1000 infrared ray imaging device.

The invention claimed is:

1. An infrared ray detection element comprising: a substrate; and a semiconductor layer disposed separately from the substrate, wherein
the semiconductor layer is provided with a diode part including first and second PN junction diodes connected in series, wherein
the diode part comprises:
an N-type first region in a well shape and a P-type first region in a well shape facing each other in the semiconductor layer,
a P-type second region disposed in the N-type first region and constituting the first PN junction diode together with the N-type first region, and
an N-type second region disposed in the P-type first region and constituting the second PN junction diode together with the P-type first region, wherein
the N-type first region and the P-type first region are provided with an N-type third region and a P-type third region, respectively, electrically connecting the first PN junction diode and the second PN junction diode via a conductive material, wherein
the N-type first region has a P-type fourth region disposed between the P-type first region and the P-type second region and electrically connected to the conductive material, and wherein
the P-type first region has an N-type fourth region disposed between the N-type first region and the N-type second region and electrically connected to the conductive material.

2. The infrared ray detection element according to claim 1, wherein
the P-type fourth region has an impurity concentration higher than the impurity concentration of the P-type first region, and/or
the N-type fourth region has an impurity concentration higher than the impurity concentration of the N-type first region.

3. The infrared ray detection element according to claim 1, wherein
the P-type third region has an impurity concentration higher than the impurity concentration of the P-type first region, and/or
the N-type third region has an impurity concentration higher than the impurity concentration of the N-type first region.

4. The infrared ray detection element according to claim 1, wherein
the P-type fourth region is disposed between the P-type second region and the N-type third region, and wherein
the N-type fourth region is disposed between the N-type second region and the P-type third region.

5. The infrared ray detection element according to claim 1, wherein
the N-type third region is disposed between the P-type second region and the P-type fourth region, and wherein the P-type third region is disposed between the N-type second region and the N-type fourth region.

6. The infrared ray detection element according to claim 1, wherein the P-type second region, the P-type third region, the P-type fourth region, the N-type second region, the N-type third region, and the N-type fourth region are disposed on a front surface of the semiconductor layer.

7. The infrared ray detection element according to claim 1, wherein the P-type fourth region is disposed into a range deeper than the N-type third region in a thickness direction of the semiconductor layer and/or the N-type fourth region is disposed into a range deeper than the P-type third region in the thickness direction of the semiconductor layer.

8. The infrared ray detection element according to claim 1, wherein the P-type fourth region has a larger dimension than the N-type third region in the width direction of the diode part, and/or the N-type fourth region has a larger dimension than the P-type third region in the width direction of the diode part.

9. The infrared ray detection element according to claim 1, wherein the diode part is one of a plurality of diode parts disposed in the semiconductor layer and connected in series, wherein the plurality of diode parts comprises a first diode part and a second diode part, and wherein the P-type second region of the first diode part is electrically connected to the N-type second region of the second diode part, or the N-type second region of the first diode part is electrically connected to the P-type second region of the second diode part.

10. A method for manufacturing an infrared ray detection element, comprising the steps of:

preparing a substrate;

disposing a semiconductor layer separated from the substrate; and disposing a diode part including first and second PN junction diodes connected in series in the semiconductor layer, wherein the step of disposing the diode part comprises the steps of disposing an N-type first region in a well shape and a P-type first region in a well shape adjacent to each other via an interface in the semiconductor layer, disposing on a front surface of the N-type first region a P-type second region, a P-type fourth region, and an N-type third region having an impurity concentration higher than the N-type first region, disposing on a front surface of the P-type first region an N-type second region, an N-type fourth region, and a P-type third region having an impurity concentration higher than the P-type first region, and disposing a conductive material extending over the N-type third region, the P-type third region, the P-type fourth region, and the P-type fourth region, wherein the P-type second region is disposed in the region farther than the P-type fourth region from the interface, and wherein the N-type second region is disposed in the region farther than the N-type fourth region from the interface.

* * * * *